US011895816B2

(12) United States Patent
Chhabra et al.

(10) Patent No.: US 11,895,816 B2
(45) Date of Patent: Feb. 6, 2024

(54) BITCELL ARCHITECTURE

(71) Applicant: Arm Limited, Cambridge (GB)

(72) Inventors: Amit Chhabra, Noida (IN); Brian Tracy Cline, Austin, TX (US)

(73) Assignee: Arm Limited, Cambridge (GB)

( * ) Notice: Subject to any disclaimer, the term of this patent is extended or adjusted under 35 U.S.C. 154(b) by 299 days.

(21) Appl. No.: 17/112,479

(22) Filed: Dec. 4, 2020

(65) Prior Publication Data

US 2022/0181331 A1   Jun. 9, 2022

(51) Int. Cl.
*H01L 21/8238* (2006.01)
*H10B 10/00* (2023.01)
*H01L 23/528* (2006.01)
*H01L 27/06* (2006.01)
*H01L 27/092* (2006.01)
*H01L 27/02* (2006.01)

(52) U.S. Cl.
CPC ..... *H10B 10/12* (2023.02); *H01L 21/823871* (2013.01); *H01L 23/528* (2013.01); *H01L 27/0922* (2013.01)

(58) Field of Classification Search
CPC ......... H01L 27/1104; H01L 21/823871; H01L 23/528; H01L 27/0922; H01L 27/0688; H01L 27/092; H01L 27/0207; H01L 27/1108
See application file for complete search history.

(56) References Cited

U.S. PATENT DOCUMENTS

| 2003/0136978 | A1* | 7/2003 | Takaura | H01L 27/0688 257/210 |
| 2006/0267100 | A1* | 11/2006 | Noguchi | H01L 29/66772 257/E21.415 |
| 2007/0147107 | A1* | 6/2007 | Yang | H01L 27/1108 365/154 |
| 2019/0131309 | A1* | 5/2019 | Liaw | H01L 21/32133 |
| 2020/0075489 | A1* | 3/2020 | Liebmann | H01L 21/823828 |
| 2020/0144264 | A1* | 5/2020 | Li | H01L 21/823807 |

* cited by examiner

*Primary Examiner* — Herve-Louis Y Assouman
(74) *Attorney, Agent, or Firm* — Pramudji Law Group PLLC; Ari Pramudji

(57) ABSTRACT

Various implementations described herein are related to a device having multiple transistors that are arranged as a bitcell. The multiple transistors may include multiple P-type transistors that are arranged in a P-over-P stack configuration, and the multiple transistors may include multiple N-type transistors that are arranged in an N-over-N stack configuration.

20 Claims, 7 Drawing Sheets

- PRIOR ART -

200B

P-over-P Architecture 204B

P-over-P Stack Configuration 214B

300B

P-over-P Split-Gate Architecture 304B

BITCELL ARCHITECTURE

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some modern bitcell architecture, conventional multi-transistor devices utilize traditional layout techniques and thus suffer from low density design application that may typically cause unintended consequences in fabrication processes. Therefore, traditional layout techniques can be inefficient, density deficient and typically fail to provide sufficient means for implementing various different layout configurations. Thus, there exists a need to improve traditional layout techniques that allow for efficient device fabrication.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to fabrication schemes and techniques for single-port memory applications in various physical layout designs. For instance, the various schemes and techniques described herein may provide for various single-port static random access memory (SRAM) bitcell architectures using complementary field-effect transistor (FET) technology. As such, the various bitcell fabrication schemes and techniques described herein provide for a novel architecture in physical layout design of bitcell architecture of multi-transistor (e.g., 6T) single-port SRAM bitcells in complementary FET technology, wherein one device is disposed on top of another device. Also, the various bitcell fabrication schemes and techniques described herein provide for varying different stack combinations of devices to be manufactured at the same time, wherein P-over-P and N-over-N devices may be manufactured along with N-over-P and P-over-N devices in the same single monolithic semiconductor die.

In some implementations, bitcell fabrication schemes and techniques described herein utilize technology that supports complimentary FET (CFET) devices, wherein each device is fabricated with nano-sheets (NS) or Fin-FET (FF) that are used to form multiple devices in multi-transistor stacks within a single monolithic semiconductor die with one device stacked on top of another device. Therefore, the various bitcell fabrication schemes and techniques described herein provide for multiple complimentary stack configurations, such as, e.g., an NN based structure having an N-over-N stack configuration and a PP based structure having a P-over-P stack configuration. In various instances, the gates for PFET devices and NFET devices may have common-gate or split-gate architecture. Further, the bitcell fabrication schemes and techniques described herein also utilize technology that supports N-over-P devices along with P-over-N devices as additional stack configurations that may be fabricated with the N-over-N and P-over-P stack configurations within the same single monolithic semiconductor die in various bitcell applications.

Various implementations of providing fabrication schemes and techniques for memory applications will be described herein with reference to FIGS. 1-5.

Figure 1:
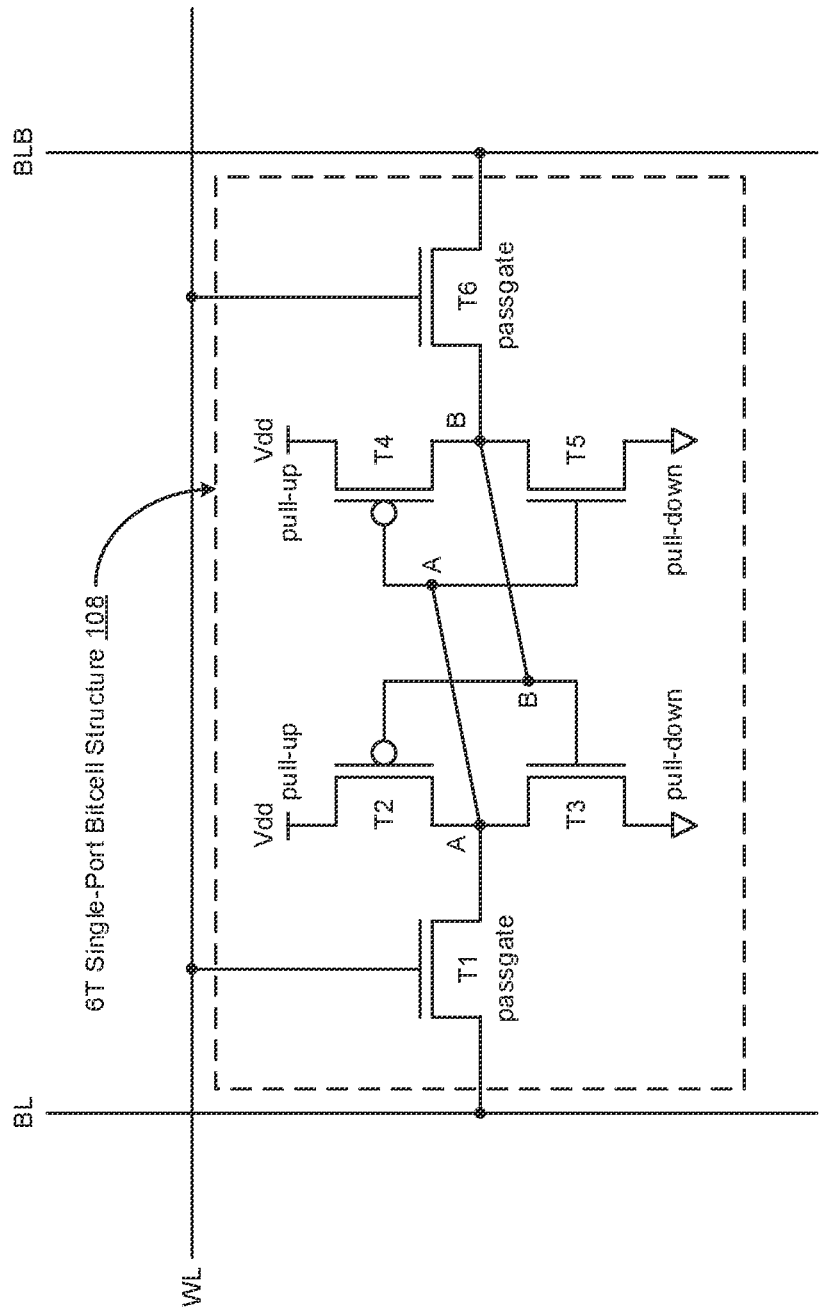
FIG. 1 illustrates a diagram of bitcell architecture in accordance with various implementations described herein.

FIG. 1 illustrates a diagram 100 of bitcell architecture 104 in accordance with various implementations described herein.

In some implementations, the bitcell architecture 104 may be implemented as a system or a device having various integrated circuit (IC) components that are arranged and coupled together as an assemblage or combination of parts that provide for physical circuit designs and various related structures. In some instances, a method of designing, providing and building the bitcell architecture 104 as an integrated system or device may involve use of various IC circuit components described herein so as to thereby implement fabrication schemes and techniques associated therewith. Also, the bitcell architecture 104 may be integrated with computing circuitry and related components on a single chip, and the bitcell architecture 104 may be implemented in various embedded systems for automotive, electronic, mobile, server and Internet-of-things (IoT) applications.

As shown in FIG. 1, the bitcell architecture 104 may be implemented with a non-volatile memory (NVM) bitcell structure 108, such as, e.g., the multi-transistor bitcell structure. For instance, in some implementations, the multi-transistor bitcell structure 108 may be configured as a multi-transistor (e.g., six transistors (6T)) single-port static random access memory (SRAM) bitcell structure. In some instances, the six-transistors (6T) may include multiple (e.g., 4) N-type metal-oxide-semiconductor (NMOS) transistors along with multiple (e.g., 2) P-type MOS (PMOS) transistors. In various implementations, a passgate transistor (T1) may be coupled between a first bitline (BL) and a node (A), and another passgate transistor (T6) may be coupled between a second bitline (BLB) and a node (B), wherein the second bitline (BLB) is complementary to the first bitline (BL). Also, a wordline (WL) may be coupled to the gates of transistors (T1, T6) to access data stored in the latch formed with transistors (T2, T3, T4, T5) via the wordline (WL) and complementary bitlines (BL, BLB). Transistors (T2, T3) may be coupled in series between voltage supply (Vdd) and ground (Gnd or Vss), wherein the node (A) is formed between pull-up transistor (T2) and pull-down transistor (T3). Also, transistors (T4, T5) may be coupled in series between voltage supply (Vdd) and ground (Gnd or Vss), wherein the node (B) is formed between pull-up transistor (T4) and pull-down transistor (T5). Further, transistors (T2, T3) may be cross-coupled with transistors (T4, T5) such that the node (A) is coupled to the gates of transistors (T4, T5) and such that the other node (B) is coupled to the gates of transistors (T2, T3). In some instances, node (A) may be referred to as node (blti), and also, node (B) may be referred to as node (blfi). Further, in various instances, transistors (T2, T4) may refer to P-type field-effect transistors (PFET), and transistors (T1, T3, T5, T6) refer to N-type FET (NFET) transistors. However, various other configurations may be used to achieve similar results and/or behavior.

The bitcell architecture 104 may be implemented with one or more core arrays of bitcells or memory cells, wherein each bitcell may be configured to store at least one data-bit value (e.g., data value related to a logical '0' or '1'). The one or more core arrays may include any number of bitcells arranged in various configurations, such as, e.g., two-dimensional (2D) memory arrays having any number of columns and any number of rows of multiple bitcells, which may be arranged in a 2D grid pattern for read and write memory access. However, even though an NVM-SRAM bitcell structure is shown and described in FIG. 1, any other type of NVM bitcell structure may be used to achieve similar results of the various bitcell fabrication techniques disclosed herein. Thus, in various instances, each bitcell may be implemented with any type of NVM memory, including, e.g., magneto-resistive RAM (MRAM) and/or any other type of useable NVM memory. Also, each bitcell may have a multi-layer MRAM bitcell with a pinned layer (PL) and a free layer (FL), and for data access, each bitcell may include a wordline (WL), and in MRAM, the bitlines may refer to a bitline (BL) and a source line (SL).

Figure 2A:
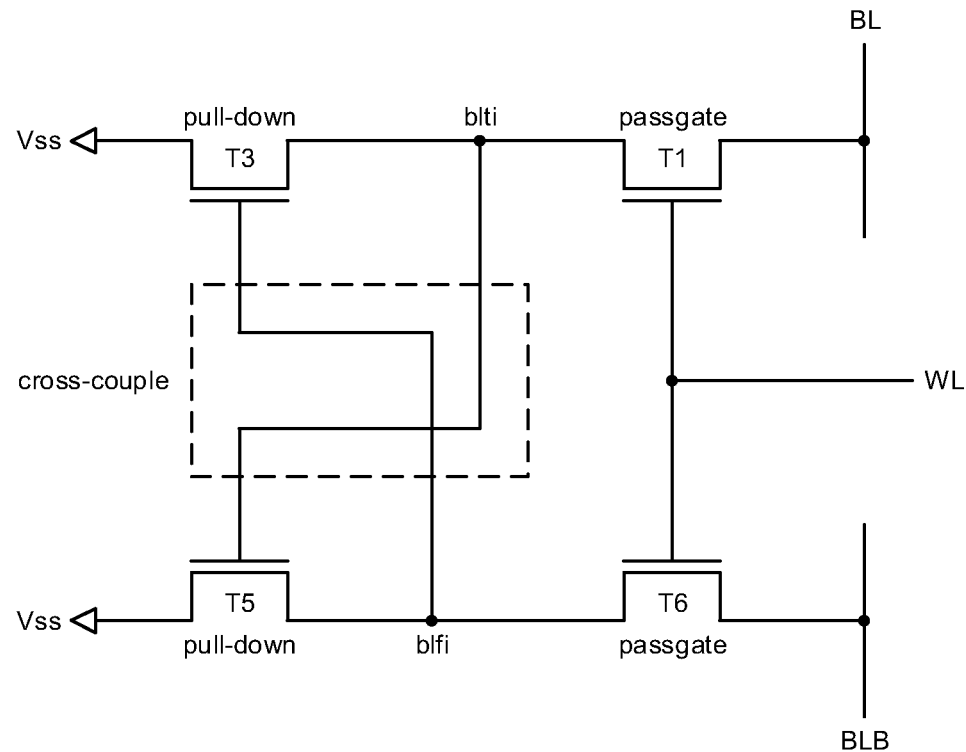
FIGS. 2A-2B illustrate diagrams of transistor architecture in accordance with various implementations described herein.
Figure 2A:
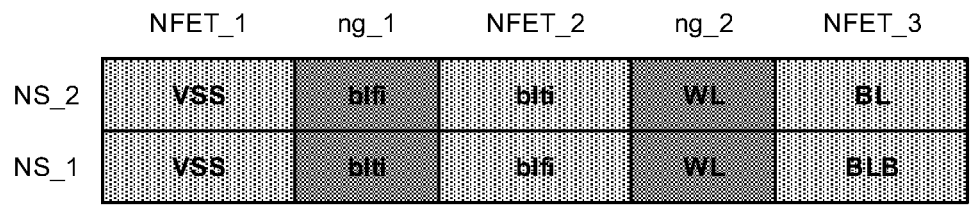
Figure 2B:
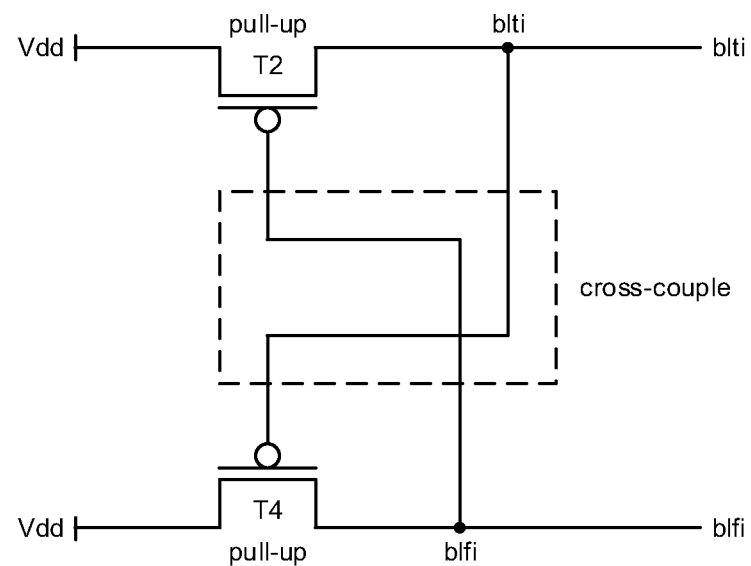
Figure 2B:
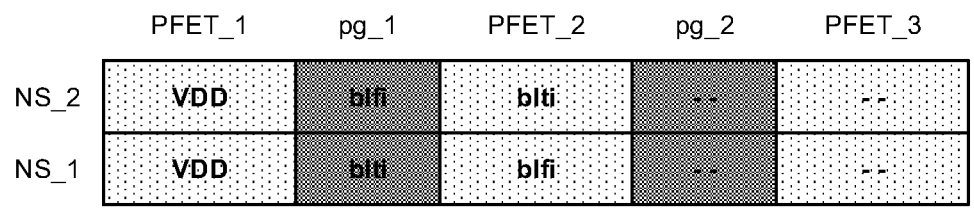

FIGS. 2A-2B illustrate various diagrams of transistor architecture associated with bitcell applications in accordance with various implementations described herein. In particular, FIG. 2A shows a diagram 200A of N-over-N transistor architecture 204A, and FIG. 2B shows a diagram 200B of P-over-P transistor architecture 204A. Moreover, the transistor architecture 204A, 204B in FIGS. 2A-2B along with the various components related thereto are associated with the bitcell architecture 104 in FIG. 1.

As shown in FIG. 2A, the N-over-N architecture 204A may include the NMOS transistors (T1, T2, T5, T6) that are arranged to provide passgate transistors (T1, T2) and cross-coupled pull-down transistors (T3, T5) in a manner as described in reference to the bitcell architecture 104 in FIG. 1. For instance, transistors (T1, T2) may be coupled in series between the first bitline (BL) and ground, and transistors (T5, T6) may be coupled in series between the second bitline (BLB) and ground. The gate of transistor (T3) may be coupled to node (B), which is disposed between transistors (T5, T6), and also, the gate of transistor (T5) may be coupled to node (A), which is disposed between transistors (T1, T3). Thus, the gates of transistors (T3, T5) may be cross-coupled to nodes (A, B) of the N-over-N architecture 204A. Moreover, the wordline (WL) may be coupled to the gates of the passgate transistors (T1, T6) for activation thereof.

In some implementations, the N-over-N architecture 204A may be fabricated in a single monolithic semiconductor die with an N-over-N stack configuration 214A that is provided as a multi-transistor stack, such as, e.g., a two-transistor NFET stack. As shown in FIG. 2A, the multi-transistor NFET stack may include multiple nano-sheet (NS) layers, such as, e.g., a first nano-sheet (NS_1) layer and a second nano-sheet (NS_2) layer that is stacked on and above the first nano-sheet (NS_1) layer. In some instances, the N-type nano-sheet (NS_1, NS_2) layers may include NFET portions (NFET_1, NFET_2, NFET_3) and n-gate portions (ng_1, ng_2) that are coupled to different circuit components of the N-over-N architecture 204A. For instance, the NFET_1 portions may be coupled to VSS (i.e., ground), the ng_1 portions may be coupled to the nodes (A, B), and the NFET_2 portions may be cross-coupled to the nodes (A, B). Also, in some instances, the ng_2 portions may be coupled to the wordline (WL), and the NFET_3 portions may be coupled to the bitlines (BL, BLB).

As shown in FIG. 2B, the P-over-P architecture 204B may include the PMOS transistors (T2, T4) that are arranged to provide cross-coupled pull-up transistors (T2, T4) in a manner as described in reference to the bitcell architecture 104 in FIG. 1. In some instances, transistor (T2) may be coupled between the node (A) and VDD, and transistor (T4) may be coupled in series between the node (B) and VDD. In reference to the cross-coupling of transistors (T2, T4), the gate of transistor (T2) may be coupled to node (B), and also, the gate of transistor (T4) may be coupled to node (A). As such, the gates of transistors (T2, T4) may be cross-coupled to nodes (B, A) of the P-over-P architecture 204B in a manner as described in reference to the bitcell architecture 104 in FIG. 1.

In some implementations, the P-over-P architecture 204B may be fabricated in a single monolithic semiconductor die with a P-over-P stack configuration 214B that is provided as a multi-transistor stack, such as, e.g., a two-transistor PFET stack. As shown in FIG. 2B, the multi-transistor PFET stack may include multiple nano-sheet (NS) layers, such as, e.g., a first nano-sheet (NS_1) layer and a second nano-sheet (NS_2) layer that is stacked on and above the first nano-sheet (NS_1) layer. In some instances, the P-type nano-sheet (NS_1, NS_2) layers may include PFET portions (PFET_1, PFET_2, PFET_3) and p-gate portions (pg_1, pg_2) that are coupled to different circuit components of the P-over-P architecture 204B. For instance, the PFET_1 portions may be coupled to VDD (i.e., voltage supply), the pg_1 portions may be coupled to the nodes (A, B), and also, the PFET_2 portions may be cross-coupled to nodes (B, A). Also, in some instances, the pg_2 portions and the PFET_3 portions are left uncoupled, and thus, the pg_2 portions and the PFET_3 portions may be left unused or etched out.

In reference to FIGS. 1 and 2A-2B, the bitcell architecture 104 along with the N-over-N architecture 204A and the P-over-P architecture 204B may be implemented as a device having multiple transistors (T1, T2, T3, T4, T5, T6) arranged as a bitcell, such as, e.g., the 6T single-port bitcell structure 108. In some instances, the multiple transistors (T1, T2, T3, T4, T5, T6) may include multiple P-type transistors (T2, T4) that are arranged in the P-over-P stack configuration 214B, and the multiple transistors (T1, T2, T3, T4, T5, T6) may also include multiple N-type transistors (T1, T3, T5, T6) that are arranged in the N-over-N stack configuration 214A. As described herein, the multiple transistors (T1, T2, T3, T4, T5, T6) may be formed in a single monolithic semiconductor die. Also, the multiple P-type transistors (T2, T4) are disposed adjacent to the multiple N-type transistors (T1, T3, T5, T6) within the single monolithic semiconductor die, which is described in reference to FIG. 4. Also, the multiple transistors (T1, T2, T3, T4, T5, T6) may be arranged as the bitcell 108 for single-port memory applications, wherein the multiple transistors (T1, T2, T3, T4, T5, T6) may include six transistors (6T), and wherein the bitcell 108 may refer to a static random access memory (SRAM) bitcell.

Also, in reference to FIGS. 1 and 2A-2B, the multiple transistors (T1, T2, T3, T4, T5, T6) may refer to field-effect transistors (FET) including P-type FET (PFET) and N-type FET (NFET). In some instances, as shown and described in reference to FIG. 3A, the multiple N-type transistors (T1, T3, T5, T6) may include a first pair of N-type transistors (T1, T6) that are arranged in a first N-over-N stack configuration 214A, and the multiple N-type transistors (T1, T3, T5, T6) may include a second pair of N-type transistors (T3, T5) that are arranged in a second N-over-N stack configuration 214A. In some instances, as shown and described in reference to FIG. 3B, the multiple P-type transistors (T2, T4) may include a pair of P-type transistors (T2, T4) that are arranged in the P-over-P stack configuration 214B. Moreover, in some instances, as shown in FIGS. 2A-2B, the pair of P-type transistors (T2, T4) may be cross-coupled with the pair of N-type transistors (T3, T5) so as to provide multiple (e.g., two) cross-coupled inverters that are utilized as a latch (or latching logic) for the bitcell 108.

Further, in reference to FIGS. 1 and 2A-2B, the pair of N-type transistors (T1, T6) may be utilized as a first passgate (T1) and a second passgate (T6) for the bitcell 108, wherein the first passgate (T1) is coupled between the first bitline (BL) and a first inverter (T2, T3) of the cross-coupled inverters, and wherein the second passgate (T6) is coupled between the second bitline (BLB, as a complement to BL) and a second inverter (T4, T5) of the cross-coupled inverters. Moreover, in some implementations, the single monolithic semiconductor die may include various other transistors, wherein the multiple transistors may include other P-type transistors and other N-type transistors that are arranged in at least one of a P-over-N stack configuration and an N-over-P stack configuration. As such, in this instance, the multiple transistors (T1, T2, T3, T4, T5, T6) having the N-over-N stack configuration 214A and the P-over-P stack configuration 214B may be manufactured in the same single monolithic semiconductor die together with the other P-type transistors and the other N-type transistors that are formed in the P-over-N stack configuration and/or the N-over-P stack configuration.

In some implementations, the P-over-P and N-over-N stack combinations may be manufactured and/or formed along with N-over-P and P-over-N stack combinations in the same single monolithic semiconductor die. Also, as shown in FIG. 2B, in reference to the first and second P-over-P stacked devices in the P-over-P stack configuration 214B, the second P-over-P stack may be left floating or may be etched out.

Figure 3A:
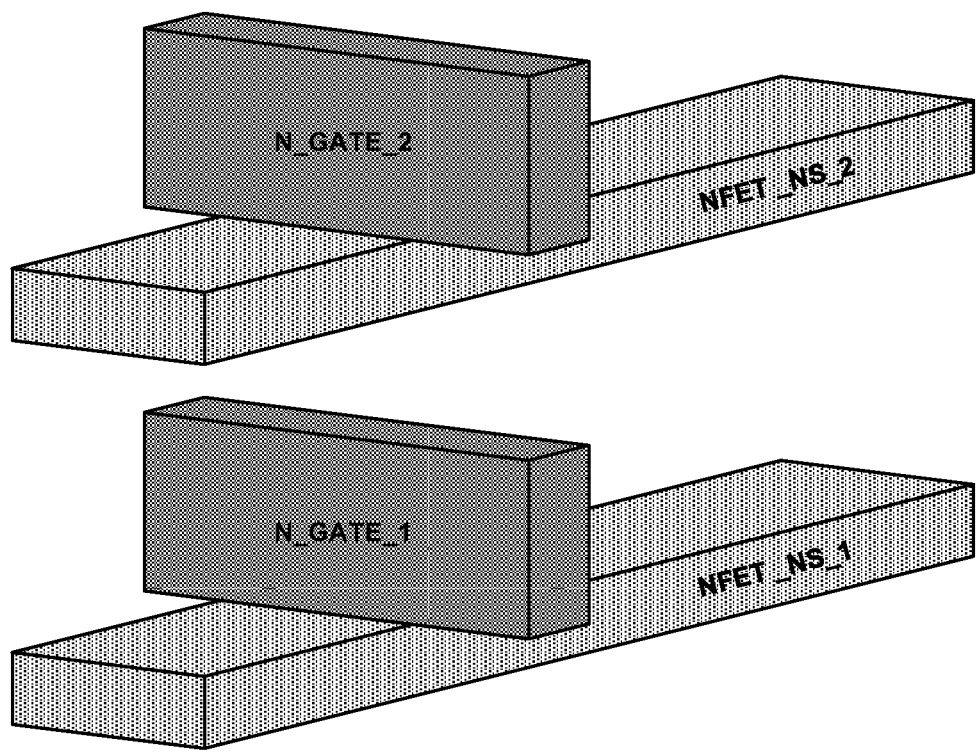
FIGS. 3A-3B illustrate a diagram of split-gate architecture in accordance with various implementations described herein.
Figure 3B:
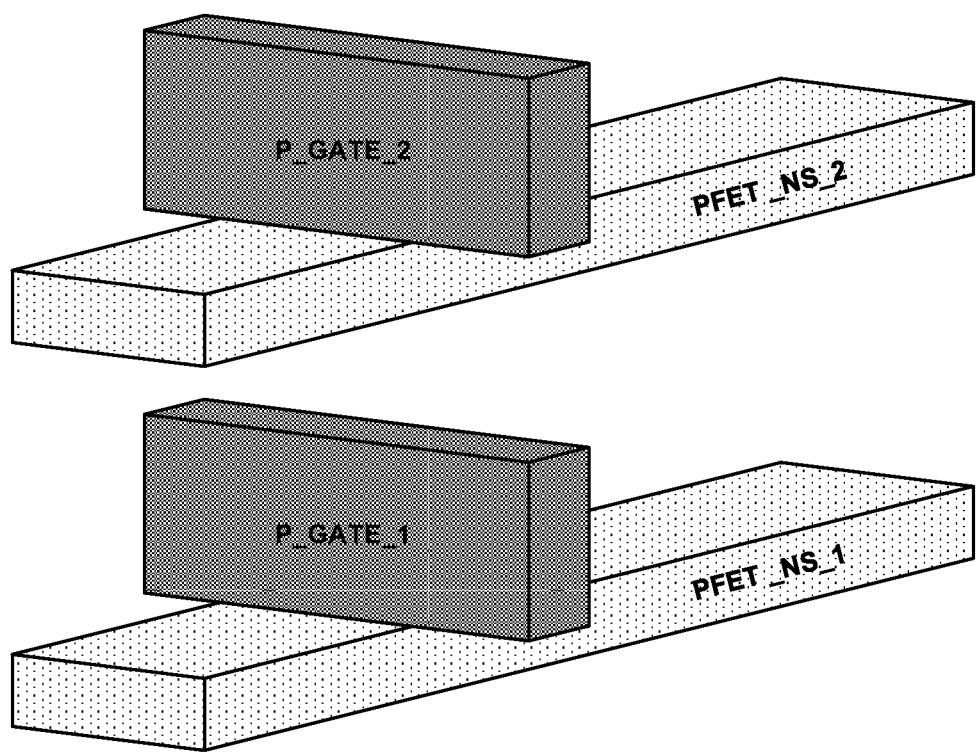

FIGS. 3A-3B illustrate diagram of split-gate architecture in accordance with various implementations described herein. In particular, FIG. 3A shows a diagram 300A of N-over-N split-gate transistor architecture 304A, and FIG. 3B shows a diagram 300B of P-over-P split-gate transistor architecture 304A. In various implementations, the split-gate architecture 304A, 304B in FIGS. 3A-3B along with the various components related thereto are related to the bitcell architecture 104 in FIG. 1, the N-over-N architecture 204A in FIG. 2A, and the P-over-P architecture 204B in FIG. 2B.

As shown in FIG. 3A, the N-over-N split-gate related transistor architecture 304A may include multiple transistors (e.g., 2 NFET devices) arranged in a multi-transistor stack configuration, such as, e.g., a first NFET formed in a first nano-sheet (NFET_NS_1) and a second NFET formed in a second nano-sheet (NFET_NS_2) that is disposed above the NFET_NS_1 device. Also, in some implementations, the split-gate architecture 304A may refer to multiple gates (e.g., poly gate lines) coupled to the multiple transistors, such as, e.g., a first gate (N_GATE_1) coupled to the NFET_NS_1 device and a second gate (N_GATE_2) coupled to the NFET_NS_2 device. This arrangement provides the N-over-N stack configuration as a two-NFET stacked device that is manufactured and/or formed in a single monolithic semiconductor die. Also, in some implementations, the multiple N-type transistors refer to N-type field-effect transistors (NFETs) that may be disposed as a pair of N-type transistors arranged in the N-over-N stack configuration.

As shown in FIG. 3B, the P-over-P split-gate related transistor architecture 304B may include multiple transistors (e.g., 2 PFET devices) arranged in a multi-transistor stack configuration, such as, e.g., a first PFET formed in a first nano-sheet (PFET_NS_1) and a second PFET formed in a second nano-sheet (PFET_NS_2) that is disposed above the PFET_NS_1 device. Also, in some implementations, the split-gate architecture 304B may refer to multiple gates (e.g., poly gate lines) coupled to the multiple transistors, such as, e.g., a first gate (P_GATE_1) coupled to the PFET_NS_1 device and a second gate (P_GATE_2) coupled to the PFET_NS_2 device. This arrangement provides the P-over-P stack configuration as a two-PFET stacked device that is manufactured and/or formed in a single monolithic semiconductor die. Also, in some implementations, the multiple P-type transistors refer to P-type field-effect transistors (PFETs) that may be disposed as a pair of P-type transistors arranged in the P-over-P stack configuration.

In some implementations, in reference to FIGS. 3A-3B, the various split-gate architectures 304A, 304B may be replaced with a common gate architecture, wherein the transistors (NFET_1, NFET_2) share a single gate structure. As such, in some instances, the pair of stacked NFET devices may share a single common gate structure.

Figure 4:
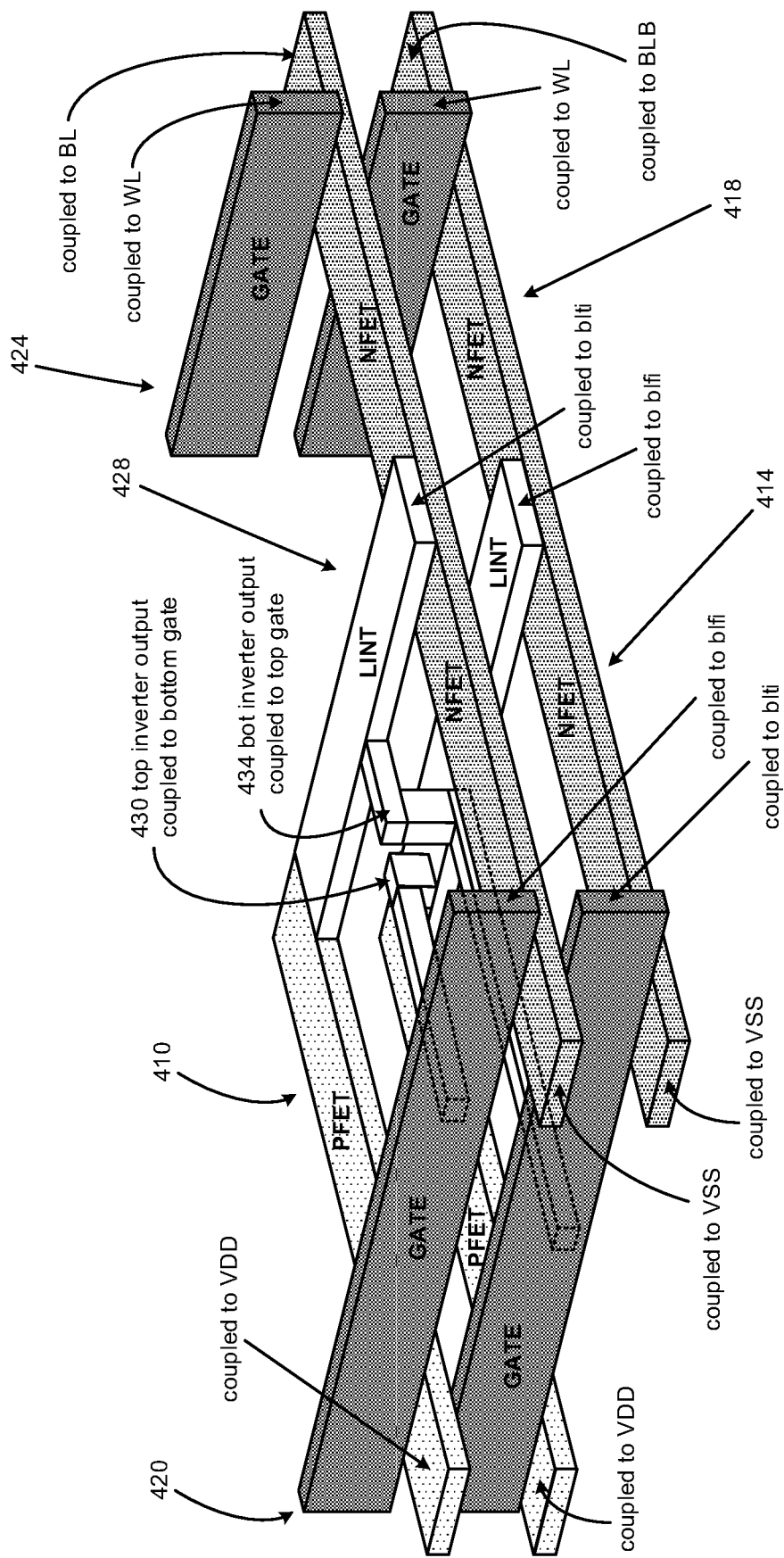
FIG. 4 illustrates a diagram of split-gate bitcell architecture in accordance with various implementations described herein.

FIG. 4 illustrates a structural diagram 400 of N-over-N and P-over-P split-gate bitcell architecture 404 in accordance with implementations described herein.

As shown in FIG. 4, the split-gate bitcell architecture 404 may provide a bitcell having a pair of P-type devices 410 arranged in a P-over-P stack configuration and a pair of N-type devices 414 arranged in an N-over-N stack configuration. In various instances, the pair of P-type devices 410 may be cross-coupled with the pair of N-type devices 414 so as to provide two cross-coupled inverters that are used as a latch for the bitcell. Also, the pair of P-type devices 410 may be disposed adjacent to the pair N-type devices 414 within a single monolithic semiconductor die, and the bitcell refers to a 6T static random access memory (SRAM) bitcell for single-port memory applications, e.g., as described in reference to the bitcell architecture 104 in FIG. 1.

In some implementations, the pair of P-type devices 410 may refer to a pair of P-type transistors that are arranged in the P-over-P stack configuration, and also, the pair of N-type devices 414 may refer to a first pair of N-type transistors that are arranged in a first N-over-N stack configuration. The split-gate bitcell architecture 404 may also include another pair of N-type devices 418 that refer to a second pair of N-type transistors that are arranged in a second N-over-N stack configuration. In this instance, the second pair of N-type transistors 418 may be utilized as passgates, such as, e.g., a first passgate and a second passgate, for the bitcell. Also, the first passgate may be coupled between a first bitline (BL) and the first inverter (e.g., upper or top PFET/NFET inverter) of the two cross-coupled inverters, and the second passgate may be coupled between the second bitline (BLB) and a second inverter (e.g., lower or bottom PFET/NFET inverter) of the two cross-coupled inverters. Also, the pair of PFETs 410 may be coupled to VDD, and the first pair of NFETs 414 may be coupled to ground (VSS).

In some implementations, the split-gate bitcell architecture 404 may have split-gate structures, such as, e.g., a first split gate structure 420 along with a second split-gate structure 424, that are coupled to the pair of PFETs 410, the first pair of NFETs 414, and the second pair of NFETs 418. The first split gate structure 420 may be coupled to the pair of PFETs 410 and the NFETs 414, and also, the second split-gate structure 424 may be coupled to the second pair of NFETs 418. Also, in some instances, the first split gate structure 420 may be cross-coupled to nodes (B, A), and the second split-gate structure 424 may be coupled to the wordline (WL).

In some implementations, the split-gate bitcell architecture 404 may have a pair of local interconnects (LINT) 428 that couple the pair of PFETs 410 to the node (A, B) disposed between the first pair of NFETs 414 and the second pair of NFETs 418. Also, a lower local interconnect (LINT) 430 may be cross-coupled to an upper gate of the first split gate structure 420, and also, an upper local interconnect (LINT) 434 may be cross-coupled to a lower gate of the first split gate structure 420. Thus, as shown in FIG. 4, the upper or top inverter output may be coupled to the lower or bottom gate, and also, the lower or bottom inverter output is coupled to the upper or top gate.

Therefore, as shown in FIG. 4, a first poly structure 410, 414 may provide the P-over-P transistors 410 and the N-over-N transistors 414, and also, the first PFET/NFET inverter along with the second PFET/NFET inverter may provide the cross-coupled latch that is formed with the upper or top portion of the transistor stacks 410, 414 and with the lower or bottom (bot) portion of the transistor stacks 410, 414. Further, in some instances, the second poly structure 418 may provide for the N-over-N transistors 414 that may be used as WL passgates, and also, connections to the bitlines (BL, BLB) may be swapped in multiple rows (e.g., 2 rows) so as to have a symmetrical structure.

In some implementations, the pair of P-type devices 410 may refer to a pair of P-type field-effect transistor (PFET) devices, and the first pair of N-type devices 414 may refer to a pair of N-type field-effect transistor (NFET) devices. Also, the second pair of N-type devices 418 may refer to a second pair of NFET devices.

In various implementations, the split-gate bitcell architecture 404 may include multiple other devices including other P-type devices and other N-type devices arranged in at least one of a P-over-N stack configuration and an N-over-P stack configuration. In this instance, the pair of P-type devices 410 arranged in the P-over-P stack configuration, the pairs of N-type devices 414, 418 arranged in the N-over-N stack configurations may be manufactured together in a single monolithic semiconductor die along with the other P-type devices and the other N-type devices arranged in the P-over-N stack configuration and the N-over-P stack configuration.

Figure 5:
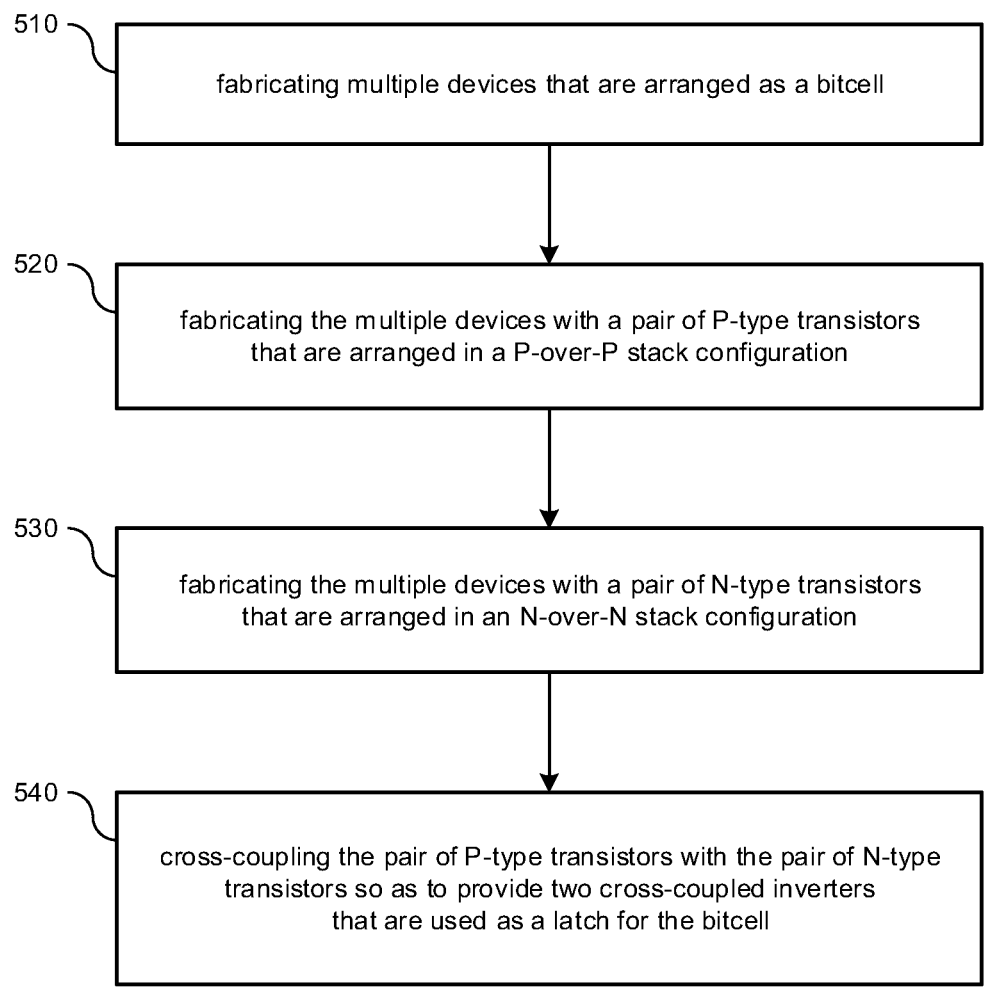
FIG. 5 illustrates a diagram of a method for fabricating bitcell architecture in accordance with various implementations described herein.

FIG. 5 illustrates a diagram of a method 500 for fabricating bitcell architecture in accordance with various implementations described herein.

It should be understood that even though the method 500 indicates a particular order of operation execution, in some cases, various particular portions of the operations may be executed in a different order, and on different systems. In other cases, additional operations and/or steps may be added to and/or omitted from method 500. Also, method 500 may be implemented in hardware and/or software. If implemented in hardware, the method 500 may be implemented with various components and/or circuitry, as described herein in reference to FIGS. 1-4C. Also, if implemented in software, method 500 may be implemented as a program and/or software instruction process configured for providing bitcell architecture schemes and techniques, as described herein. Further, if implemented in software, various instructions associated with implementing method 500 may be stored in memory and/or a database. For instance, various types of computing devices having a processor and memory may be configured to perform method 500.

In various implementations, method 500 may refer to a method of designing, providing, building, fabricating and/or manufacturing various non-volatile memory (NVM) bitcells as an integrated device that may involve use of various components and materials described herein. The non-volatile memory (NVM) bitcells may be integrated with various computing circuitry and related components on a single chip, and the non-volatile memory bitcells may be implemented in various embedded systems for various electronic, mobile and/or Internet-of-things (IoT) applications, including remote sensor nodes.

At block 510, method 500 may fabricate multiple devices that are arranged as a bitcell. At block 520, method 500 may fabricate the multiple devices with a pair of P-type transistors that are arranged in a P-over-P stack configuration. At block 530, method 500 may fabricate the multiple devices with a pair of N-type transistors that are arranged in an N-over-N stack configuration. At block 540, method 500 may cross-couple the pair of P-type transistors with the pair of N-type transistors so as to provide two cross-coupled inverters that are used as a latch for the bitcell. The pair of P-type transistors are disposed adjacent to the pair N-type transistors within a single monolithic semiconductor die, and the bitcell may refer to an SRAM bitcell for single-port memory applications.

In some implementations, method 500 may also include fabricating the multiple devices with another pair of N-type transistors that are arranged in another N-over-N stack configuration. The another pair of N-type transistors may be utilized as a first passgate and a second passgate for the bitcell, and the first passgate may be coupled between a first bitline and a first inverter of the two cross-coupled inverters. The second passgate may be coupled between a second bitline and a second inverter of the two cross-coupled inverters. Moreover, in some implementations, method 500 may also include fabricating multiple devices including P-type devices and N-type devices arranged in at least one of a P-over-N stack configuration and an N-over-P stack configuration. In this instance, the pair of P-type transistors arranged in the P-over-P stack configuration, the pair of N-type transistors arranged in the N-over-N stack configuration may be manufactured together in a single monolithic semiconductor die along with the P-type devices and N-type devices arranged in the P-over-N stack configuration and the N-over-P stack configuration.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are implementations of a device having multiple transistors arranged as a bitcell. The multiple transistors may include multiple P-type transistors that are arranged in a P-over-P stack configuration, and the multiple transistors may include multiple N-type transistors that are arranged in an N-over-N stack configuration.

Described herein are various implementations of a bitcell. The bitcell may have a pair of P-type devices arranged in a P-over-P stack configuration, and also, the bitcell may have a pair of N-type devices arranged in an N-over-N stack configuration. The pair of P-type devices may be cross-coupled with the pair of N-type devices so as to provide two cross-coupled inverters that are used as a latch for the bitcell.

Described herein are various implementations of a method. The method may fabricate multiple devices that are arranged as a bitcell. The method may fabricate the multiple devices with a pair of P-type transistors that are arranged in a P-over-P stack configuration. The method may fabricate the multiple devices with a pair of N-type transistors that are arranged in an N-over-N stack configuration. The method may cross-couple the pair of P-type transistors with the pair of N-type transistors so as to provide two cross-coupled inverters that are used as a latch for the bitcell.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A device comprising:
   multiple transistors arranged as a bitcell;
   wherein the multiple transistors include multiple P-type transistors that are sequentially arranged in a P-over-P stack configuration,
   wherein the multiple transistors include multiple N-type transistors that are sequentially arranged in an N-over-N stack configuration, and
   wherein the multiple P-type transistors in the P-over-P stack configuration are disposed alongside the multiple N-type transistors in the N-over-N stack configuration.

2. The device of claim 1, wherein the multiple transistors are formed in a single monolithic semiconductor die.

3. The device of claim 2, wherein:
   the P-type transistors are arranged vertically in the P-over-P stack configuration,
   the N-type transistors are arranged vertically in the N-over-N stack configuration, and
   the multiple P-type transistors in the P-over-P stack configuration are disposed horizontally adjacent to the multiple N-type transistors in the N-over-N stack configuration within the single monolithic semiconductor die.

4. The device of claim 1, wherein the multiple transistors are arranged as the bitcell for single-port memory applications, wherein the multiple transistors include six transistors (6T), and wherein the bitcell refers to a static random access memory (SRAM) bitcell.

5. The device of claim 1, wherein the multiple transistors include field-effect transistors (FET) including P-type FET (PFET) and N-type FET (NFET).

6. The device of claim 1, wherein:
   the multiple P-type transistors include a pair of P-type transistors that are arranged in the P-over-P stack configuration, and
   the multiple N-type transistors include a pair of N-type transistors that are arranged in the N-over-N stack configuration.

7. The device of claim 6, wherein:
   the pair of P-type transistors are cross-coupled with the pair of N-type transistors so as to provide two cross-coupled inverters that are utilized as a latch for the bitcell.

8. The device of claim 7, wherein:
   the pair of N-type transistors refer to a first pair of N-type transistors that are arranged in a first N-over-N stack configuration, and the multiple N-type transistors include a second pair of N-type transistors that are arranged in a second N-over-N stack configuration.

9. The device of claim 8, wherein:
the second pair of N-type transistors are utilized as a first passgate and a second passgate for the bitcell,
the first passgate is coupled between a first bitline and a first inverter of the two cross-coupled inverters, and
the second passgate is coupled between a second bitline and a second inverter of the two cross-coupled inverters.

10. The device of claim 1, wherein:
the multiple transistors include P-type transistors and N-type transistors arranged in at least one of a P-over-N stack configuration and an N-over-P stack configuration, and
the multiple transistors having the P-over-P stack configuration, the N-over-N stack configuration, the P-over-N stack configuration and the N-over-P stack configuration are manufactured together in a single monolithic semiconductor die.

11. A bitcell comprising:
a pair of P-type devices sequentially arranged in a P-over-P stack configuration; and
a pair of N-type devices sequentially arranged in an N-over-N stack configuration,
wherein the pair of P-type transistors in the P-over-P stack configuration is disposed alongside the pair of N-type transistors in the N-over-N stack configuration, and
wherein the pair of P-type devices is cross-coupled with the pair of N-type devices so as to provide two cross-coupled inverters that are used as a latch for the bitcell.

12. The bitcell of claim 11, wherein:
the pair of P-type transistors is arranged vertically in the P-over-P stack configuration,
the pair of N-type transistors is arranged vertically in the N-over-N stack configuration, and
the pair of P-type devices is disposed horizontally adjacent to the pair N-type devices within a single monolithic semiconductor die, and
the bitcell refers to a static random access memory (SRAM) bitcell for single-port memory applications.

13. The bitcell of claim 11, wherein the pair of P-type devices refer to P-type field-effect transistor (PFET) devices, and wherein the pair of N-type devices refer to N-type field-effect transistor (NFET) devices.

14. The bitcell of claim 11, wherein:
the pair of P-type devices refer to a pair of P-type transistors that are arranged in the P-over-P stack configuration, and
the pair of N-type devices refer to a first pair of N-type transistors that are arranged in a first N-over-N stack configuration.

15. The bitcell of claim 14, further comprising:
another pair of N-type devices that refer to a second pair of N-type transistors that are arranged in a second N-over-N stack configuration.

16. The bitcell of claim 15, wherein:
the second pair of N-type transistors are utilized as a first passgate and a second passgate for the bitcell,
the first passgate is coupled between a first bitline and a first inverter of the two cross-coupled inverters, and
the second passgate is coupled between a second bitline and a second inverter of the two cross-coupled inverters.

17. The bitcell of claim 11, further comprising:
multiple devices including P-type devices and N-type devices arranged in at least one of a P-over-N stack configuration and an N-over-P stack configuration,
wherein the pair of P-type devices arranged in the P-over-P stack configuration, the pair of N-type devices arranged in the N-over-N stack configuration are manufactured together in a single monolithic semiconductor die along with the P-type devices and the N-type devices that are arranged in the P-over-N stack configuration and the N-over-P stack configuration.

18. A method comprising:
fabricating multiple devices that are arranged as a bitcell;
fabricating the multiple devices with a pair of P-type transistors that are sequentially arranged in a P-over-P stack configuration;
fabricating the multiple devices with a pair of N-type transistors that are sequentially arranged in an N-over-N stack configuration; and
cross-coupling the pair of P-type transistors with the pair of N-type transistors so as to provide two cross-coupled inverters that are used as a latch for the bitcell,
wherein the pair of P-type transistors in the P-over-P stack configuration is disposed alongside the pair of N-type transistors in the N-over-N stack configuration.

19. The method of claim 18, further comprising:
fabricating the multiple devices with another pair of N-type transistors that are arranged in another N-over-N stack configuration,
wherein the another pair of N-type transistors are utilized as a first passgate and a second passgate for the bitcell,
wherein the first passgate is coupled between a first bitline and a first inverter of the two cross-coupled inverters, and
wherein the second passgate is coupled between a second bitline and a second inverter of the two cross-coupled inverters.

20. The method of claim 18, further comprising:
fabricating multiple devices including P-type devices and N-type devices arranged in at least one of a P-over-N stack configuration and an N-over-P stack configuration,
wherein the pair of P-type transistors arranged in the P-over-P stack configuration, the pair of N-type transistors arranged in the N-over-N stack configuration are manufactured together in a single monolithic semiconductor die along with the P-type devices and the N-type devices that are arranged in the P-over-N stack configuration and the N-over-P stack configuration.

* * * * *